United States Patent
Lindell et al.

(10) Patent No.: US 7,426,109 B2
(45) Date of Patent: Sep. 16, 2008

(54) SYSTEM AND METHOD FOR ADAPTIVE INFORMATION HANDLING SYSTEM COOLING PROFILES

(75) Inventors: Donald Lindell, Peoria, IL (US); Phil Baurer, Leander, TX (US); Darrell Chieng, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 387 days.

(21) Appl. No.: 11/281,057

(22) Filed: Nov. 16, 2005

(65) Prior Publication Data

US 2007/0109725 A1    May 17, 2007

(51) Int. Cl.
*H05K 7/20* (2006.01)
(52) U.S. Cl. .............................. 361/687; 361/688
(58) Field of Classification Search ............ 702/132, 702/99; 361/695, 687, 688; 713/300
See application file for complete search history.

(56) References Cited

U.S. PATENT DOCUMENTS

| | | | |
|---|---|---|---|
| 5,249,741 A | 10/1993 | Bistline et al. | 236/49.3 |
| 5,935,252 A | 8/1999 | Berglund et al. | 713/300 |
| 6,101,459 A | 8/2000 | Tavallaei et al. | 702/132 |
| 6,268,664 B1 | 7/2001 | Rolls et al. | 307/32 |
| 6,400,045 B1 | 6/2002 | Hosokawa et al. | 307/117 |
| 6,888,332 B2 | 5/2005 | Matsushita | 318/471 |
| 6,948,008 B2 * | 9/2005 | Hawkins et al. | 710/15 |
| 2003/0128509 A1 * | 7/2003 | Oudet | 361/687 |
| 2003/0161101 A1 | 8/2003 | Hillyard et al. | 361/687 |
| 2003/0225542 A1 | 12/2003 | Liu et al. | 702/132 |
| 2004/0111559 A1 | 6/2004 | Heil | 711/114 |
| 2005/0024827 A1 | 2/2005 | Espinoza-Ibarral et al. | |
| 2007/0089446 A1 * | 4/2007 | Larson et al. | 62/259.2 |

FOREIGN PATENT DOCUMENTS

| | | |
|---|---|---|
| GB | 2 405 034 A | 2/2005 |
| GB | 2406673 | 6/2005 |
| JP | 11085323 A | 3/1999 |
| WO | WO 2005/017478 | 2/2005 |

* cited by examiner

*Primary Examiner*—Stephen W Jackson
*Assistant Examiner*—Danny Nguyen
(74) *Attorney, Agent, or Firm*—Hamilton & Terrile, LLP; Robert W. Holland

(57) ABSTRACT

An information handling system cooling profile is adjusted as the hardware configuration of the information handling system changes with the addition or removal of processing components. A cooling profile engine adapts the cooling profile to adjust for a processing components thermal profile, such as by retrieving the thermal profile from the component and applying the thermal profile to a cooling profile table to retrieve a cooling profile associated with a configuration having the component. In one embodiment, cooling profile adjustments are managed through a network so that the adjusted cooling profile adapts to other information handling systems operating nearby, such as blade information handling systems of a blade server.

18 Claims, 3 Drawing Sheets

SYSTEM AND METHOD FOR ADAPTIVE INFORMATION HANDLING SYSTEM COOLING PROFILES

BACKGROUND OF THE INVENTION

1. Field of the Invention

The present invention relates in general to the field of information handling system cooling, and more particularly to a system and method for information handling system adaptive cooling profiles.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems are typically built from a wide variety of processing components selected to provide desired performance characteristics. For instance, information handling systems are built from one or more central processing units (CPUs) having a variety of operating speeds, from hard disk drives and random access memories having a variety of storage capacities and access speeds, and from a variety of daughter cards that provide various functions, such as network and peripheral interfaces. Generally, each of these processing components produces excess heat that is removed from the information handling system with one or more cooling fans. The size and operational characteristics of cooling fans for an information handling system depends not only upon the amount of excess heat produced by the components but also the size and shape of the chassis that houses the components and the external operating conditions, such as the external air temperature and the proximity of other information handling systems. During the design of an information handling system, these factors are taken into account to build a cooling profile that adjusts cooling fan speeds for detected operating conditions to maintain desired cooling parameters. Ideally, the cooling fan speed is adjusted to within a range that produces minimal acoustic noise that is otherwise bothersome to users.

One difficulty with setting a cooling profile to determine cooling fan speeds is that users sometimes alter the configuration of an information handling system after delivery of the system from the manufacturer. For instance, users often insert add-in cards that generate additional heat and throw off manufacturer set cooling profiles. Changes to hardware configurations are particularly troublesome where information handling systems have sensitive cooling requirements, such as in server systems that are typically operated in small spaces. For example, blade server information handling systems are often tightly packed as "blades" within a blade server rack. Each blade typically has a system manager, such as a Baseboard Management Controller (BMC), that adjusts operating constraints, such as cooling fan speeds. Insertion of additional hardware components in a blade will not only affect the cooling profile of that blade but also the cooling profiles of nearby blades. Non-optimal cooling profiles can, for instance, result in cooling fans of some blades operating at increased speeds with excessive acoustic noise while other blades have cooling fans that operate at reduced speeds that provide less effective cooling. Additionally, non-optimal cooling profiles can lead to thermal stress that reduces information handling system processing component life.

SUMMARY OF THE INVENTION

Therefore a need has arisen for a system and method which adapts an information handling system cooling profile to changes in hardware configuration.

In accordance with the present invention, a system and method are provided which substantially reduce the disadvantages and problems associated with previous methods and systems for setting an information handling system cooling profile. A cooling profile applied to run a cooling fan to cool processing components of an information handling system is adapted to adjust for changes in the hardware configuration of the information handling system, such as the addition or removal of processing components within a housing of the information handling system.

More specifically, a management processor operating in an information handling system manages the operation of a cooling fan according to a cooling profile. The cooling profile is set based upon the thermal profile of processing components disposed in a housing of the information handling system. Upon detection of a change to the hardware configuration of the information handling system that affects the thermal profile, a cooling profile engine adjusts the cooling profile to adapt to the newly-detected configuration, such as by adapting an algorithm that operates cooling fan speed to account for a thermal profile of an added or removed processing component. The thermal profile is retrieved from an added component, looked up from a table on the information handling system or looked up from a remote table through a network. The cooling profile is derived from modification of an existing cooling profile with the application of the component thermal profile or looked up from a table of cooling profiles that associates the cooling profiles with various hardware configurations. In one embodiment, the cooling profile is retrieved from a remote information handling system that considers additional factors, such as the proximity of other information handling systems and the thermal profiles and cooling profiles of such systems.

The present invention provides a number of important technical advantages. One example of an important technical advantage is that an information handling system cooling profile is automatically adjusted for changes in the hardware configuration of the information handling system, such as the addition or removal of components. Adjusting a cooling profile to match changes in hardware configuration provides optimized cooling to maintain desired environmental conditions within an information handling system housing while running the cooling fan a appropriate speeds for reduced acoustical noise. Further, managing cooling profile adjustments to account for other nearby information handling systems balances cooling needs and constraints for multiple systems as the hardware configuration of any one system changes.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Automated adjustments to an information handling system cooling profile adapt cooling to changes in the hardware configuration of the information handling system. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
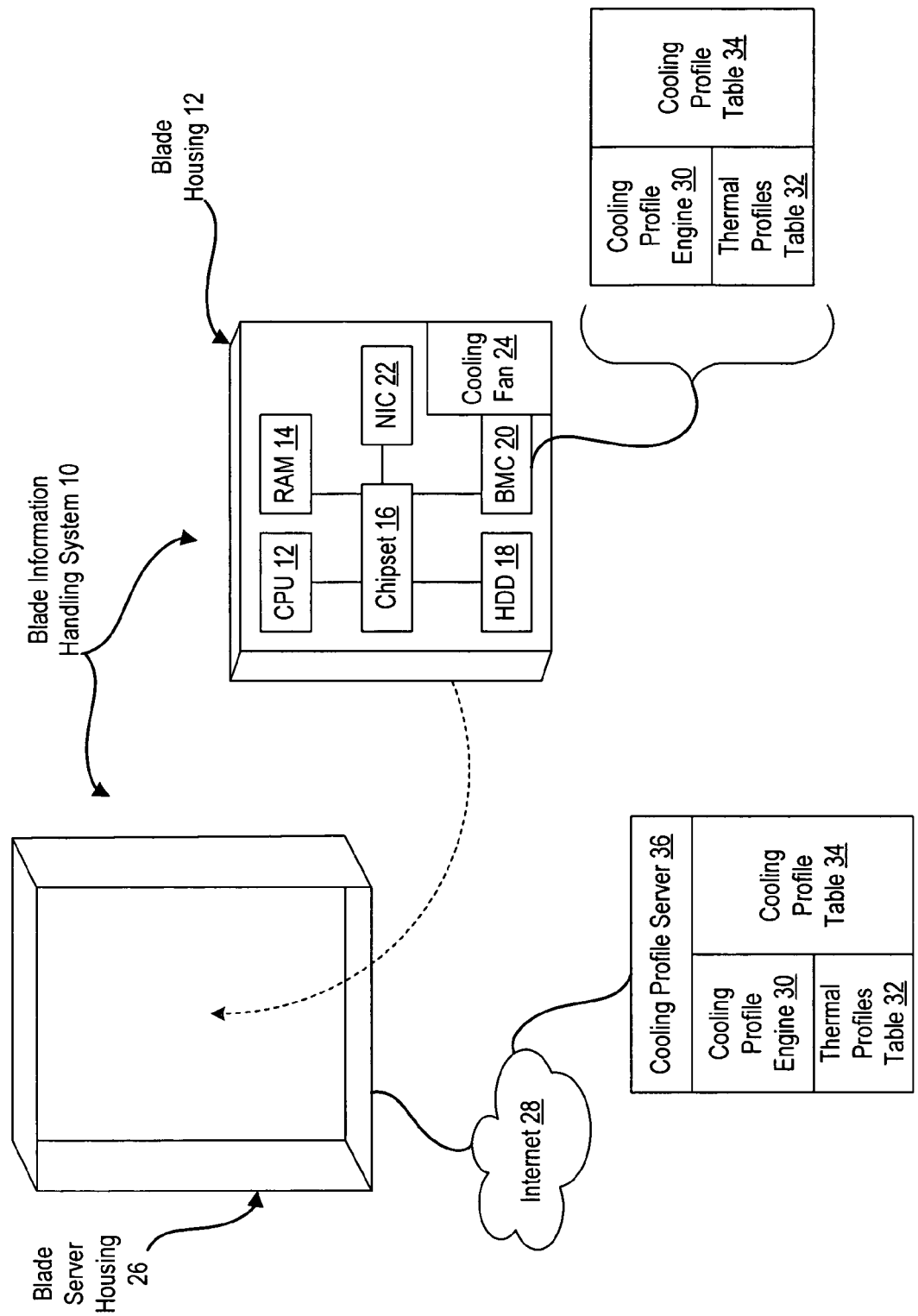
FIG. 1 depicts a block diagram of an information handling system configured to adjust its cooling profile to adapt to changes in its hardware configuration.

Referring now to FIG. 1, a block diagram depicts an information handling system 10 configured to adjust its cooling profile to adapt to changes in its hardware configuration. Information handling system 10 is a blade system having processing components disposed in a blade housing 12, such as a CPU 14, RAM 16, a chipset 18, a hard disk drive 20, a BMC 22 and a network interface card 24. The processing components cooperate to process information, which results in the build-up of heat in housing 12 that is removed by a cooling fan 24. Cooling fan 24 operates at variable speeds under the command of BMC 20, which is a management processor that manages the physical operation of the processing components. For instance, BMC 20 applies a cooling profile that defines a desired cooling fan speed for a given set of environmental conditions, such as temperature within housing 12, temperature at a particular processing component and a variety of operating conditions, such as processing demands. Blade housing 12 is sized to fit into a blade server housing 26 that supports the interaction of plural blade information handling systems in a blade server configuration. For instance, blade server housing 26 provides communication between blade information handling systems 10 and a network 28 to support primary network communications as well as management communications, such as IPMI.

Information handling system 10 has the ability to support addition and removal of processing components from within housing 12, such as daughter cards that provide networking capability or additional memory. Changes to the hardware configuration by the addition or removal of hardware components is typically performed while the system is powered down and detected at power up or boot by firmware running within chipset 16. Changes to the hardware configuration by the addition or removal of processing components alters the amount of heat produced within housing 12 during operation of the processing components, and thus alters the effectiveness of the operation of cooling fan 24 by BMC 20 under the cooling profile. For instance, the addition of heat-producing processing components to housing 12, such as additional NICs, RAM, hard disk drives, or even CPUs, disrupts the operation of cooling fan 24 so that it operates at excessive or insufficient speeds. The removal of heat-producing processing components has a similar impact.

In order to provide improved operations of cooling fan 24, the cooling profile used by BMC 20 to set the speed of cooling fan 24 is automatically updated to adapt to changes in hardware configuration by a cooling profile engine 30. For instance, if chipset 16 detects a change to the hardware configuration of information handling system 10, such as by the addition or removal of hardware components, a message is sent to BMC 20 to identify the added or removed processing component. Cooling profile engine 30 applies a thermal profile associated with the processing component to generate an updated cooling profile for the operation of cooling fan 24. For instance, in one embodiment the added processing component stores a thermal profile that is communicated to BMC 20 upon detection of the component and applied by BMC 20 to update the cooling profile. The thermal profile retrieved from the component is stored by BMC 20 for use in the event the component is subsequently removed from information handling system 10. In an alternative embodiment, thermal profile values for various components are stored in a thermal profiles table 32 and so that a value associated with an added or removed component is retrieved upon detection of the component and applied to adjust the cooling profile. In another alternative embodiment, a cooling profile table 34 stores plural cooling profiles, each cooling profile associated with a hardware configuration of information handling system 10. The hardware configuration with the added or removed component is looked up in cooling profile table 34 so that the cooling profile associated with the hardware configuration is applied by BMC 20.

Additional flexibility for setting a cooling profile of information handling system 10 is available by setting the cooling profile with a remote information handling system. For instance, having one blade information handling system 10 of plural blades in blade server housing 26 set the cooling profiles for the other blades allows the overall thermal profile of blade server housing 26 to be taken into account. Thus, for instance, a centralized cooling profile engine 30 for plural blade information handling systems 10 allows changes to the hardware configuration of one blade to effect the cooling profile of that blade and also proximate blades. In one embodiment, cooling profile engine 30 operates from a remote cooling profile server 36 interfaced through a network, such as Internet 28. The use of a remote cooling profile server 36 supports up-to-date cooling profiles and thermal profiles adjusted to adapt to processing components as information on the thermal profiles of the processing components becomes available. Available side band network management interfaces, such as IPMI, allow management of cooling profiles with minimal disruption to information handling system operations.

Figure 2:
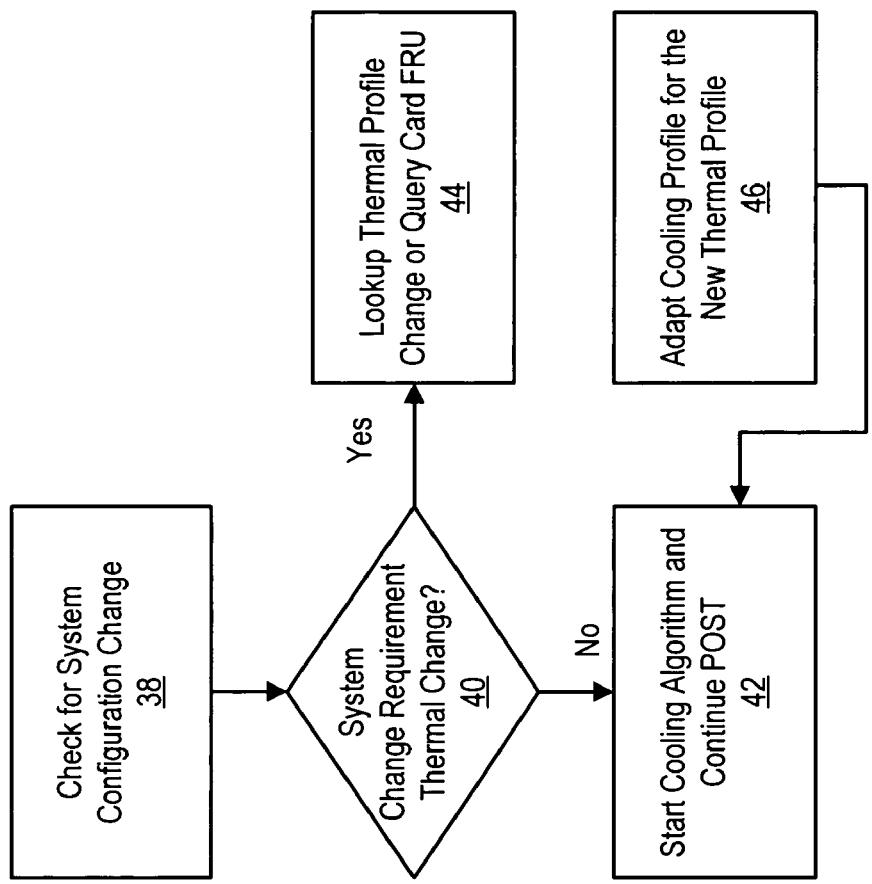
FIG. 2 depicts a flow diagram of a process for adjusting an information handling system cooling profile to changes in hardware configuration.

Referring now to FIG. 2, a flow diagram depicts a process for adjusting an information handling system cooling profile to changes in hardware configuration. The process begins at step 38 with comparison of the detected hardware configuration to the hardware configuration used for the current cooling profile. At step 40, a determination is made of whether a system configuration change introduces a thermal profile change requiring an update to the cooling profile. If not, the process continues to step 42 to start the cooling profile algorithm as already set and continue with system POST. If an update to the cooling profile is found at step 40, the process continues to step 44 to look up the thermal profile change from available thermal profiles or retrieve the thermal profile from an added processing component, such as by query to a daughter card FRU. At step 46, the cooling profile of the information handling system is adapted to compensate for the new thermal profile presented by the addition or removal of the processing component, and the process continues to step 42 to continue POST.

Figure 3:
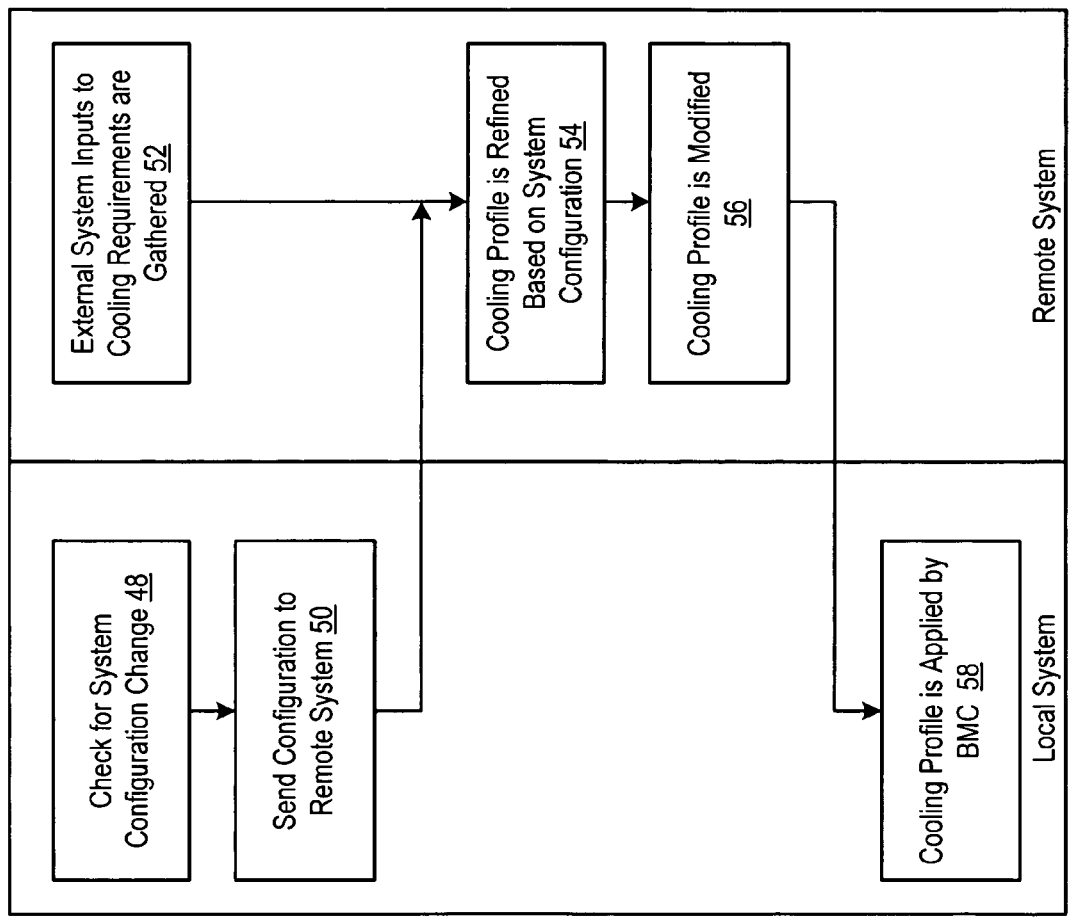
FIG. 3 depicts a flow diagram of a process of remote adjustments to an information handling system cooling profile.

Referring now to FIG. 3, a flow diagram depicts a process of remote adjustments to an information handling system cooling profile. The process begins at step 48 with a check at a local information handling system for a configuration change. At step 50, the configuration of the local system is sent to a remote system for calculation of an appropriate cooling profile. At step 52, the remote system gathers external system inputs to cooling requirements so that, at step 54, the cooling profiles of managed information handling systems are refined based on newly-detected configurations at the managed systems. At step 56, the cooling profile of managed systems are updated to account for the changed configuration and, at step 58, the updated cooling profile is communicated to the affected system for application by the BMC of that system.

Although the present invention has been described in detail, it should be understood that various changes, substitutions and alterations can be made hereto without departing from the spirit and scope of the invention as defined by the appended claims.

What is claimed is:

1. An information handling system comprising:
   a housing operable to integrate into a server housing, the server housing having plural server information handling systems;
   plural processing components disposed in the housing and operable to process information;
   a cooling fan disposed in the housing proximate the processing components and operable to run at selectable rates to provide cooling airflow to the processing components;
   a management processor disposed in the housing and interfaced with the cooling fan, the management processor operable to select the rate for the cooling fan to run according to detected environmental conditions and a cooling profile; and
   a cooling profile engine interfaced with the management processor, the cooling profile engine operable to adjust the cooling profile for a change detected in the processing components disposed in the housing, the cooling profile engine operable to apply thermal profiles of the plural server information handling systems to adjust the cooling profile.

2. The information handling system of claim 1 wherein the change detected in the processing components comprises the addition of a processing component, the information handling system further comprising a thermal profile associated with the added processing component, the cooling profile engine applying the thermal profile to adjust the cooling profile.

3. The information handling system of claim 2 wherein the thermal profile is stored on the added processing component, the cooling profile engine retrieving the thermal profile from the added processing component.

4. The information handling system of claim 2 wherein the thermal profile is stored at a network location, the cooling profile engine retrieving the thermal profile from the network location.

5. The information handling system of claim 1 wherein the change detected in the processing components comprises the removal of a processing component, the information handling system further comprising a thermal profile associated with the removed processing component, the cooling profile engine applying the thermal profile to adjust the cooling profile.

6. The information handling system of claim 1 wherein the management processor comprises a Baseboard Management Controller (BMC), the BMC running the cooling profile engine.

7. A method for adjusting an information handling system cooling profile of an information handling system having a hardware configuration, the information handling system disposed in a server housing with plural other information handling systems, the method comprising:
   detecting a change in the hardware configuration of an information handling system;
   retrieving a thermal profile associated with the changed hardware configuration;
   applying the retrieved thermal profile and thermal profiles associated with the other information handling systems to adjust the cooling profile of the information handling system; and
   cooling the information handling system according to the adjusted cooling profile.

8. The method of claim 7 wherein detecting a change comprises detecting removal of a hardware component from the information handling system.

9. The method of claim 7 wherein detecting a change comprises detecting addition of a hardware component to the information handling system.

10. The method of claim 9 wherein retrieving a thermal profile comprises:
    storing a thermal profile associated with the added hardware component on the hardware component; and
    retrieving the thermal profile from the added hardware component.

11. The method of claim 9 wherein retrieving a thermal profile comprises:
    storing a thermal profile associated with the added hardware component at a network location; and
    retrieving the thermal profile from the network location.

12. The method of claim 11 wherein the information handling system comprises a blade, the server housing comprises a blade server housing, and the other information handling systems comprise blades and wherein the network location comprises one of the plural blades.

13. The method of claim 12 wherein applying the thermal profile further comprises applying thermal profiles associated with the plural blades to adjust the cooling profile.

14. The method of claim 7 wherein applying the retrieved thermal profile further comprises:
    storing plural cooling profiles in a table, each cooling profile associated with a hardware configuration;
    looking up the changed hardware configuration in the table; and
    applying cooling profile of the cooling profile table that is associated with the changed hardware configuration to the information handling system.

15. The system of claim 14 wherein the cooling profile engine is further operable to retrieve a thermal profile associated with the added hardware component and to apply the retrieved thermal profile to adjust the cooling profile.

16. The system of claim 15 wherein the cooling profile engine retrieves the thermal profile from the hardware component.

17. A system for adjusting an information handling system cooling profile, the system comprising:
    a management processor operable to apply the cooling profile to command a cooling fan for a hardware configuration, the hardware configuration having plural hardware components, each hardware component having a thermal profile; and
    a cooling profile engine interfaced with the management processor, the cooling profile engine operable to adapt the cooling profile to a change in the hardware configuration from the addition of a hardware component to the information handling system, the cooling profile engine further operable to adapt the cooling profile based on thermal profiles of one or more information handling systems located proximate to the information handling system having the chance in hardware configuration.

18. The system of claim 17 further comprising a cooling profile table having plural cooling profiles, each cooling profile associated with a hardware configuration, the cooling profile engine adapting the cooling profile to changes in the hardware configuration by looking up the hardware configuration in the cooling profile table and applying the associated cooling profile.

* * * * *